United States Patent
Faubert et al.

(10) Patent No.: US 6,387,807 B1
(45) Date of Patent: May 14, 2002

(54) METHOD FOR SELECTIVE REMOVAL OF COPPER

(75) Inventors: Richard Faubert, Phoenix, AZ (US); John A. Adams, Escondido, CA (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

(21) Appl. No.: 09/772,722

(22) Filed: Jan. 30, 2001

(51) Int. Cl.$^7$ ............................................. H01L 21/44
(52) U.S. Cl. ...................................................... 438/687
(58) Field of Search .......................................... 438/687

(56) References Cited

U.S. PATENT DOCUMENTS

| | | |
|---|---|---|
| 5,542,874 A | 8/1996 | Chikaki |
| 5,688,360 A | 11/1997 | Jairath |
| 5,792,709 A | 8/1998 | Robinson et al. |
| 5,810,964 A | 9/1998 | Shiraishi |
| 5,934,979 A | 8/1999 | Talieh |
| 5,944,582 A | 8/1999 | Talieh |
| 6,121,152 A | 9/2000 | Adams et al. |
| 6,211,071 B1 * | 4/2001 | Lukanc et al. ............... 438/687 |
| 6,268,289 B1 * | 7/2001 | Chowdhury et al. ......... 438/687 |
| 2001/0016365 A1 * | 8/2001 | Chou et al. .................. 438/687 |

FOREIGN PATENT DOCUMENTS

| | | | |
|---|---|---|---|
| GB | 2 324 750 A | 4/1998 | .............. E05D/3/06 |
| WO | WO 97/40525 | 4/1997 | ........... H01L/21/00 |
| WO | WO 99/00831 | 6/1998 | .......... H01L/21/304 |

\* cited by examiner

*Primary Examiner*—John F. Niebling
*Assistant Examiner*—Lynne A. Gurley
(74) *Attorney, Agent, or Firm*—Snell & Wilmer, L.L.P.

(57) ABSTRACT

A method for polishing a copper pattern on a workpiece is disclosed. The invention provides for selective micropolishing of local regions of divergence of the profile of the copper pattern, to a predetermined state wherein the profile more closely approximates the profile of surrounding surfaces. Thereafter, the entire workpiece surface is polished in accordance with a predetermined polish profile. In the case of semiconductor wafers, local regions of a copper layer at the periphery of the wafer often have a thickness which is outside the thickness range for which a chemical mechanical polishing (CMP) tool can effectively polish the copper layer in accordance with a predetermined polish profile. According to one aspect of the present invention, local regions at the periphery of the wafer are first selectively polished to a predetermined state, after which a CMP tool can polish the entire wafer in accordance with a predetermined polish profile to achieve a desired surface configuration, whether planar or curved.

10 Claims, 6 Drawing Sheets

METHOD FOR SELECTIVE REMOVAL OF COPPER

BACKGROUND OF THE INVENTION

1. Field of Invention

The invention relates to a method for polishing a copper layer on a workpiece, and particularly to polishing a copper layer on a workpiece such as a semi-conductor wafer where it is important to polish the copper layer in accordance with a predetermined polish profile.

2. Description of the Related Art

Chemical mechanical polishing (CMP) is now a commonly used technique for planarizing thin films of copper deposited onto a workpiece such as a semiconductor wafer to form damascene and dual damascene interconnect wires and vias. The method can also be applied to other workpieces, such as flat panel displays. In the chemical mechanical polishing process, the surface of the workpiece is subjected to both abrasion and chemical treatment through the use of a chemical slurry in conjunction with polishing motion between a polishing pad and the workpiece surface. Another polishing technique does not employ a chemical slurry, but incorporates abrasive particles into a "fixed abrasive" material used to fabricate the polishing pad. Still another technique for polishing copper films is electropolishing.

Briefly, in CMP, the workpiece to be polished is first placed in a carrier (or holder), where it is held immovably with the workpiece surface to be polished facing a polishing pad that has a surface area substantially greater than the workpiece surface. A chemically reactive slurry is supplied either through channels in the polishing pad, or directly onto the workpiece surface so that it enters into the interface between the polishing pad and the surface. To achieve polishing, movement may be imparted to the carrier, the polishing pad, or both. These movements include rotational, orbital, and linear movement (in one or more directions).

One of the recurring problems associated with CMP is the tendency to produce regions that are over-polished, and other regions that are under-polished. This kind of "differential polishing" is particularly common in areas adjacent to the perimeter of the workpiece surface, especially when polishing electrodeposited copper thin films.

Electrodeposited copper thin films on semiconductor wafers tend to have areas of thicker deposition. Typical film thickness deposited for performing damascene or dual damascene copper wafers is on the order of 1 micron. In certain areas of the wafer, the particular features of the semiconductor die patterns forming the vias and interconnect trenches may cause the deposition of copper to be more rapid than in less structured areas of the die. Typical variation seen is on the order of an additional 0.5 microns thickness. A copper CMP process can normally process semiconductor wafers with this type of thickness variation and produce acceptable product. However, an additional feature in electroplated (EP) copper wafers may be present on the wafer. The electrode or set of electrodes contact a very thin seed layer of copper that had been deposited by physical vapor deposition (PVD) or chemical vapor deposition (CVD) on top of a diffusion barrier layer during the early parts of forming a damascene structure. During electroplating of the copper film, some ring style electrodes may leave a thicker peripheral ring or "skirt" of copper on the outer top surface. Some multiple point contact electrodes may leave not only a local thicker area around each electrode but also leave a void directly under the point of contact, creating a small raised structure surrounding a very thin deposit "volcano" or "scalloped" structure in the film deposition. Unfortunately, for the typical 1 micron copper film deposition, the peripheral ring or skirt on the outer top surface of the workpiece may have up to an additional 1 micron of material deposited due to the electrode structures and the process of the deposition.

The extra copper material deposited due to the electrodes makes copper CMP particularly difficult. The thinner areas of the film are cleared before the other peripheral areas. Polishing long enough to clear the outer thicker areas usually results in excessive dielectric erosion and metal thinning in the other parts of the workpiece.

In general, CMP apparatus provide a compromise between a high rate of material removal and an acceptable variation in final film thickness, when semiconductor wafers are being polished. It is generally thought that a uniform removal rate, in accordance with a predetermined polish profile, will achieve a planar surface. However, as previously described, many thin films, especially those formed of the newer copper technology, are not deposited on the surface of the workpiece in a uniform manner. In these films, it is frequently necessary to remove material from the surface in accordance with the material that was not uniformly deposited. Conventional CMP processes, designed to polish a copper layer to a predetermined polish profile, on the assumption that thin films were somewhat uniformly laid down, experience difficulties with the removal of non-uniform thin films. For example, a CMP process may be tailored for "center fast" material removal or "center slow" removal depending upon the generally expected thickness distribution of the thin film material on the workpiece surface. Such a CMP process does not completely compensate for the actual variations in thickness in localized areas on the workpiece surface.

SUMMARY OF THE INVENTION

The invention provides a method and apparatus for polishing a surface of a workpiece, whereon there is deposited a copper or other metallic pattern, such as a film, on at least a portion of the surface, in a manner which addresses issues related to the non uniform deposition of the metal onto the workpiece surface.

According to the present invention, local regions of the metal pattern such as a film or layer, which would present problems in achieving a desired surface planarity or curvature using a predetermined polish profile, are selectively polished before the metal layer is polished in accordance with the predetermined polish profile in order to achieve a closer file with the desired planarity or curvature. For example, where a copper layer has local regions that are extra thick, or has a "volcano" or scalloped configuration (e.g. at the periphery of the layer), these local regions are first selectively polished to reduce their thickness to such an extent that these regions more closely match the surrounding workpiece surface regions, before the overall surface is polished in accordance with the predetermined polish profile. Similarly, if local regions of the copper layer have other surface characteristics which would make the entire copper layer more difficult to polish in one step in accordance with a predetermined polish profile, then local regions are first selectively polished, to bring them to a state where the local regions of the copper layer and the rest of the surface can then be effectively polished in accordance with the predetermined polish profile.

While reference may be made to copper as an example of the metal patterns contemplated, clearly other metal patterns also benefited by application of the invention.

BRIEF DESCRIPTION OF THE DRAWINGS

The following drawings are illustrative of embodiments of the invention and therefore do not limit the scope of the invention, but are presented to assist in providing a proper understanding of the invention. The drawings are not to scale, and are intended for use in conjunction with the explanations in the following detailed description section.

DETAILED DESCRIPTION

Figure 1:
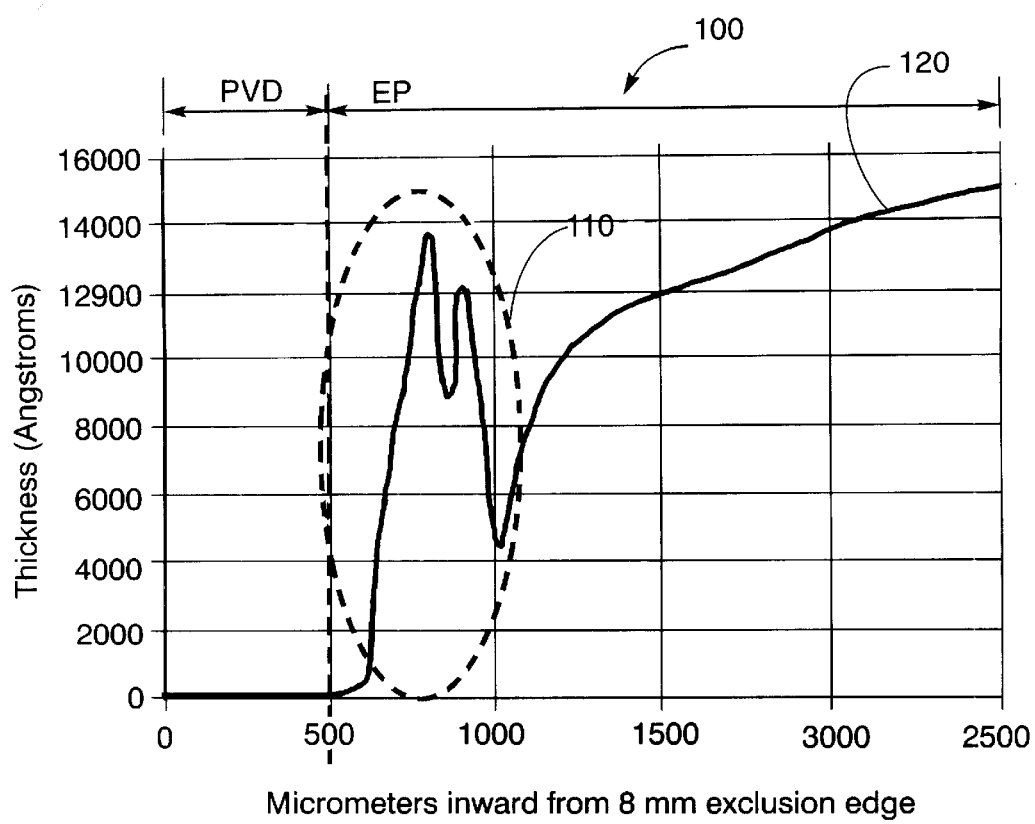
FIG. 1 is a graph charting a thickness scan of a 200-millimeter diameter semiconductor copper sheet film wafer, showing the thickness of the deposited copper and the profile of the ring or "skirt" of copper at the periphery of the wafer.

As set forth above, the present invention relates to a method for polishing a metal pattern, such as a copper layer on a workpiece, by selectively polishing local regions of the pattern to a predetermined state, and then polishing the surface in accordance with a predetermined polish profile. The invention may be applied to a wide range of workpieces requiring precision surfaces regardless of whether planar or curved, such as semiconductor wafers, flat panel displays, lenses, and the like.

The invention provides for selective polishing of identified local regions of a surface to be polished, that are at least partially covered with a metal film or layer, to conform these local regions to a predetermined state, that better enables the surface to then be polished to better achieve a more uniformly planar (or curved) final polished surface. The local regions may be thicker, i.e. protrude upward in relief from surrounding more conformal surfaces of the workpiece, or otherwise irregular in the sense of presenting difficulties in attempting a uniform overall surface polish to achieve a desired planar or curved surface that more closely conforms to specifications or that conforms more frequently, to reduce the rate of rejects produced. In the case of surfaces where local metal covered surfaces areas extend upward in relief to an extent beyond that of other portions of the metal layered surface, reducing the thickness or height of these local areas improves the overall planarity of the workpiece surface a priori, and thereby places the workpiece surface in a state where it can be more effectively uniformly polished in accordance with a predetermined polish profile.

In this application, polishing a metal pattern or surface in accordance with a "predetermined polish profile" means polishing to a finished polish profile that is considered acceptable for a particular workpiece, e.g. in order to meet a customer's requirements for that workpiece (either as a finished product or as work in progress) or to significantly reduce the potential reject rate of final products that rely upon achievement of a surface profile that conforms to a certain ideal, such as near perfect planarity (in the case of semiconductor fabrication, for example) or conformity to a curvature. It is recognized that for a particular predetermined polish profile, perfect planarity (or curvature) may not be achievable and determination of planarity (or curvature) is limited by the accuracy of measuring instruments. Notwithstanding, the invention is designed to provide a means to improve attainment of an acceptable polish profile for a particular workpiece to achieve less divergence of the thickness of surface layers on local regions from the remainder of the layered surface, by first selectively polishing divergent local regions of the surface to reduce the degree of divergence, and then polishing the entire surface in accordance with the predetermined polish profile. In the event that the workpiece surface is not planar, but curved, such as in the case of a lens or curved optical mirror, then the non-conforming regions are selectively polished, to improve conformity to a design curvature or contour, before the surface is polished to a predetermined polish profile for such a design curvature or contour.

In the specification and claims reference to "copper layer" and "copper film" are synonymous and are also synonymous with "copper pattern", it being understood that copper films/layers may be discontinuous and form "patterns" on a surface, or continuous and thus form a continuous pattern. Moreover, while the specification frequently refers to "copper" in explaining the invention, the invention encompasses other metals, especially those inlaid by damascene and/or dual damascene type processes.

FIG. 1 is a graph 100 charting a thickness a scan 120, starting at 8 mm from the edge radially inward 2500 microns, of a copper film or 200-millimeter diameter semiconductor wafer. FIG. 1 shows the thickness of the deposited copper 120 as about 14,000 Angstroms and also the thickness of the ring or "skirt" of copper at the edge of the wafer (circled by 110); the thin copper seed layer covered by the ring-style electrode is shown on the chart as the data during the first 500 microns of the scan and identified with the PVD label; the electroplated copper is identified with the EP label. The scan of FIG. 1 was generated using a metrology system from KLA-Tencor of San Jose, Calif. known as the P2, but other systems may also be used. For example, non-destructive contact techniques such as direct contact resistance measurement (i.e. a multi-point probe); mechanical step height (i.e. a profilameter); electrical snake pattern test for line resistance; and the like. There are also non-contact, non-destructive techniques, such as eddy current systems when a metal object to be measured is inserted into a magnetic field and current change is measured; and acoustic technologies, somewhat akin to depth-finder sonic technology. Destructive measurement techniques may also be used, for example SIMS/SEM that uses ions to mill a trench into the surface of the wafer and direct measurements of metal height can then be made using a scanning electron microscope (SEM). SEM can also be used to view a multiplicity of cross sections through a wafer to measure thicknesses directly. In another technique, Auger electron spectrometry/scanning Auger Microscopy is used to irradiate a sample surface to produce Auger electrons, each having an energy characteristic of the electron producing element. Depth profiling uses an independent ion beam to sputter the surface while using AES/SAM to analyze each successive depth. The above are non-limiting examples of applicable measurement techniques, and others are also useful.

The area 110 of copper film has a scalloped profile with a thickness of about 1 micron from the trough to the peak of the scallop. This type of area 110 causes significant copper wafer CMP polishing difficulties. The invention addresses this deposited copper irregularity, among others, and teaches how to prepolish the are to closer conformity to surrounding surfaces before general polishing over all (or most of) the surfaces commences.

Figure 2:
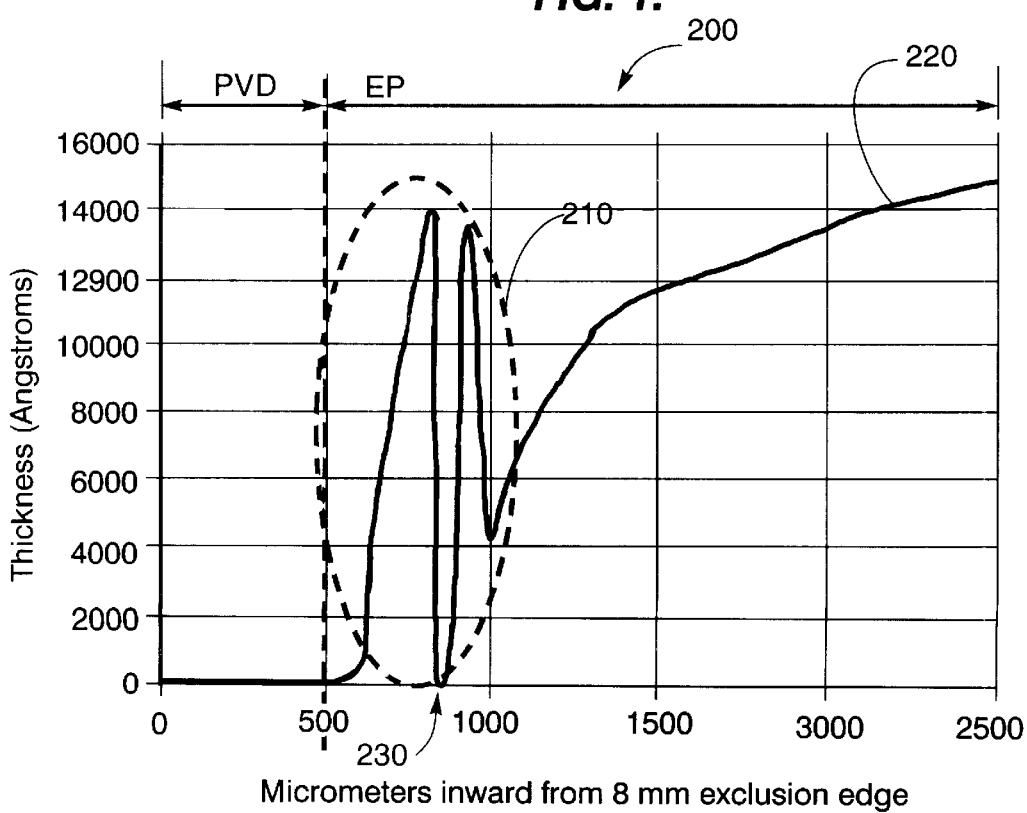
FIG. 2 is another scan of the 200-millimeter diameter semiconductor copper sheet film wafer shown in FIG. 1, showing the thickness of the deposited copper and the point contact effect of the electrode at the periphery of the wafer.

FIG. 2 is graph 200 charting thickness 220 of another P2 scan, starting at 8 mm from the edge radially inward 2500 microns, of the same 200-millimeter diameter semiconductor copper sheet film wafer shown in FIG. 1. FIG. 2 shows the thickness of the deposited copper 220; the area of the skirt (encircled by 210) presenting a potential problem area, and the effect of a point contact 230 of the electrode within the skirt. FIG. 2 shows that no significant amount of copper is electroplated under the point contact 230: The area of the skirt encircled by 210 which shows a thickness at least 1 micron from the trough to the peak of a scallop, and which may cause significant copper polishing difficulties. These difficulties are addressed by the invention as well.

It should be further noted that a workpiece such as a semiconductor wafer usually has electronic circuit portions formed in a central region, but experience indicates that the local regions of divergent thickness of a copper layer usually overlay areas of the workpiece which are outside (i.e. do not overlay) that central circuit-bearing region.

Figure 8:
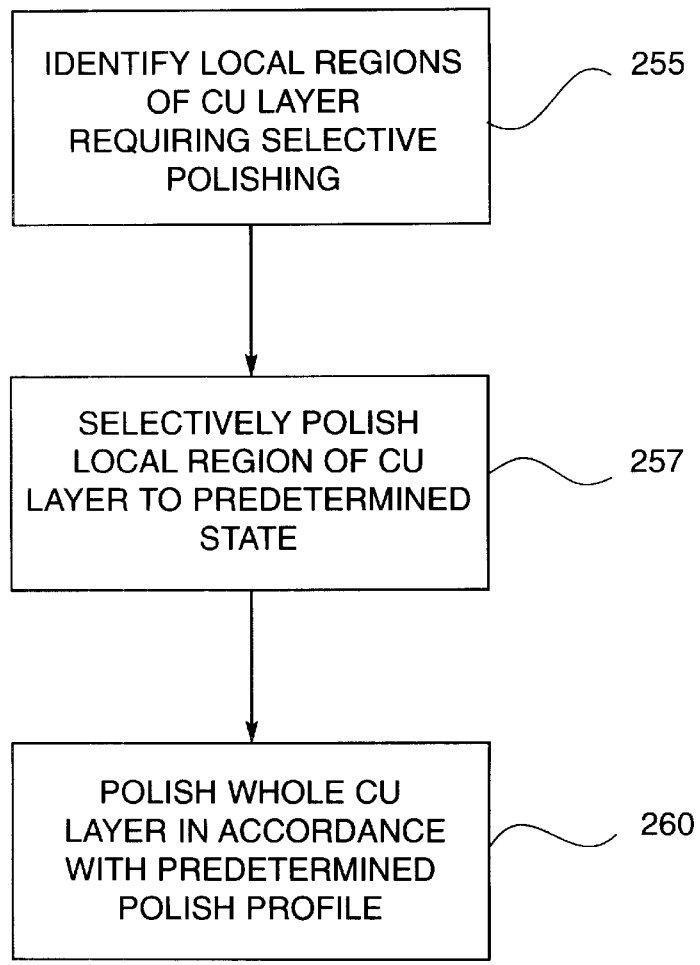
FIG. 8 is a schematic illustration of the basic steps of polishing a copper layer on a workpiece, in accordance with the present invention.

FIG. 8 schematically illustrates a manner in which a copper layer may be polished, according to the principles of the present invention. In a first step 255, local regions of the workpiece where the copper film varies more particularly from the surface thickness/profile of other areas of the copper film are identified. Once identified, then in step 257, these regions are selectively polished, to bring them to a predetermined state of closer conformity to the desired intermediate profile. Next, in step 260, the entire workpiece is polished to achieve a predetermined polish profile. When a desired final profile is obtained, the polishing is terminated.

The local regions of the copper layer which are to be selectively polished can be identified in several ways. For example, the copper layer on a workpiece can be scanned, to identify the local regions of the copper layers whose thickness present problems for a CMP or other polishing operation usually designed to polish the entire workpiece surface. The results of the scan may then be automatically compared to a desired standard to identify the extent of deviation. The extent of deviation may be a function of extent of thickness deviation and the size of the local areas deviating from the standard. These comparisons may be carried out by using a digital signal processor ("computer") programmed suitably for the purpose, or otherwise. The apparatus for selectively polishing the local regions, which is discussed in more detail below, can then be controlled to selectively polish those identified local regions requiring selective prepolishing of the invention, before the main polishing operation.

Alternatively, the profile-divergent local regions of a copper layer on each production workpiece in turn can be identified by comparing its surface thickness profile with the thickness profile of a sample copper layer deposited on a standardized workpiece that has the same surface area as the production workpiece, and that was prepared by the same process. Thus, by analyzing the thickness profile of the copper layer on the standard workpiece, and identifying local regions of variation from the major portion of the copper layer, it can be reasonably concluded that the corresponding regions of the production workpiece will have the same/similar variations, and will have to be selectively polished before the main CMP polishing operation. The apparatus for selective polishing is then programmed to routinely and selectively polish identified local regions of production workpieces, before the main CMP polishing operation without need to scan each workpiece to determine whether selective polishing is required. This mode of operation assumes a relatively uniform production process.

In both of the foregoing non-limiting alternatives, the thickness of the copper layer may be determined by known commercially available scanning devices and techniques. The selective polishing apparatus can then be programmed or otherwise controlled, by conventional techniques, to selectively polish local regions to a predetermined state before the main CMP polishing operation.

Figure 3:
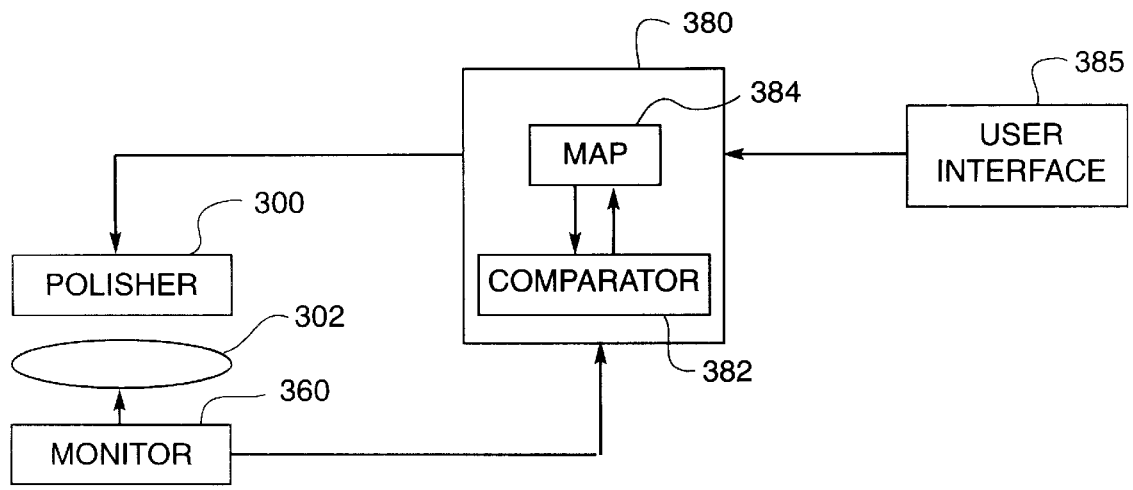
FIG. 3 is a schematic illustration of an embodiment of a controlled micro-polishing system for selectively polishing a localized area of a copper layer on a workpiece, in accordance with the invention.

Still another alternative for identifying and selectively polishing local regions of a copper layer is the use of a micropolisher 300 which is controlled by a digital signal processor that compares input from a monitor with a stored map of a workpiece surface, as shown in FIG. 3, for example.

FIG. 3 is a schematic of a "micropolisher" system for selectively polishing a local area of a copper layer. As shown, a workpiece 302 (typically supported on a holder) is polished with a pad or abrasive surface of the polisher 300 that is smaller than the surface of the workpiece so as to permit localized polishing. While this pad polishes the workpiece 302, the surface of the workpiece is monitored by monitor 360. Monitor 360 is in communication with controller 380 that includes software and memory. The memory includes a contour map 384 of a desired surface for workpiece 302, including ranges of deviation permissible from an overall planarity of the surface of the workpiece. The controller also includes a comparator function 382 that compares information from the monitor for specific regions or points on the workpiece surface with the map 384. The comparator identifies regions of the surface that exceed the permissible deviation from the contour map. These regions are selectively polished, in accordance with the present invention. Preferably, the controller 380 is in communication with a user interface 385, such as a keyboard or mouse with a video display unit, that facilitates operator access to the control system.

Figure 4:
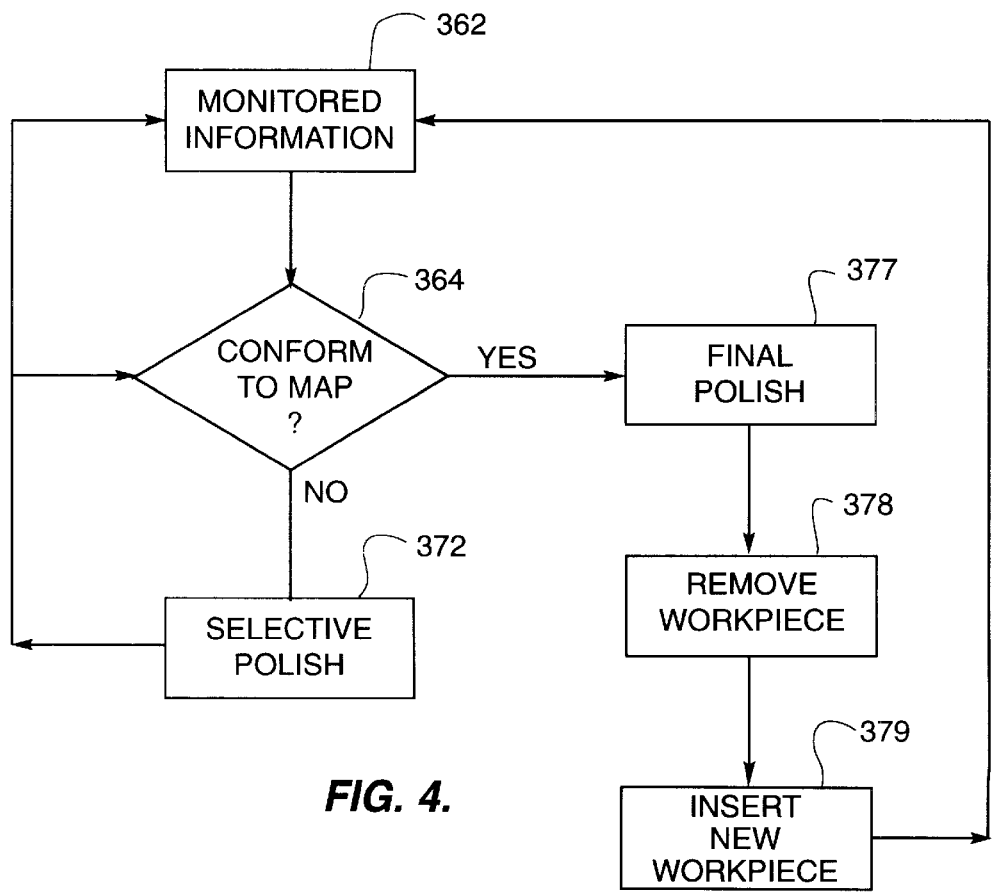
FIG. 4 is a block diagram illustrating the logic of the micropolishing system of FIG. 3.

FIG. 4 is a simplified representation of a feedback control system useful in selective polishing of local regions of a copper layer on a workpiece, according to the principles of the invention. Information from surface monitors, designated as monitored information 362, is compared to standard contour map information in block 364. If there are no local regions that deviate from the surface profile beyond a predetermined degree of deviation, the workpiece undergoes final polishing, in step 377. Final polishing is also monitored, and once an end point is detected by comparing monitored information with a standard, the workpiece is removed from the holder in step 378. Then, a new workpiece is inserted into the holder in step 379 and the process initiates again.

If, on the other hand, there are local regions of the workpiece that are identified in block 364 as having a copper surface contour exceeding the permitted deviation from the contour of the map, those local regions are targeted for selective polishing. The identified local regions are selectively polished in step 372 while monitoring to detect achievement of a predetermined state, wherein the workpiece surface regional variation is reduced to such an extent as to permit more ready polishing of the surface to conform to a predetermined polish profile. Once it is achieved, the workpiece undergoes final overall polishing in step 377.

In the embodiment of FIG. 3, the predetermined state would be achieved when the local regions of the copper layer achieve surface conformity with the map. In order to selectively polish local regions of a copper layer, the controller 380 may adjust pressure of polishing and/or speed and mode(s) of polishing in accordance with a protocol the controls variables that affect the rate of material removal from the surface. Other controlled variables may include slurry flow, slurry temperature, slurry type, chemical additives, and pad type. Thus, pressure may be controlled in those regions that are beyond a certain minimum range of conformity with the map. Moreover, speed can also be increased in these regions to increase the rate of material removal. Since polishing may be carried out in several modes, including high speed rotation, orbital polishing, linear polishing, and vibratory polishing, the mode of polishing can also be altered. For example, high-speed orbital motion may be employed on the pad while slow X and Y motions may position the pad over the local regions of the wafer W which require selective polishing. Downforce can be reduced to zero to transit over regions of the wafer that do not require selective polishing. Alternatively, the polishing pad can be operated in a high-speed rotary motion with similar slow X and Y motions to position the polishing pad at the selected local regions. Another mode would be rapid motion in the X and Y axis forming any arbitrary motion path onto the wafer, and combined with a slow to fast orbital or rotary motion of the pad. A preferred motion is to have a small high-speed orbit of the polishing pad, with the orbit radius of about 1 mm to about 10 mm at an orbit speed of about 500 to 30,000 orbits per second, with the positioning controlled by coordinated X and Y axis movements and the downforce controlled to affect the desired removal rate. More preferred is an orbit speed of about 5,000 to 10,000 with an orbit radius of about 5 mm.

Figure 5:
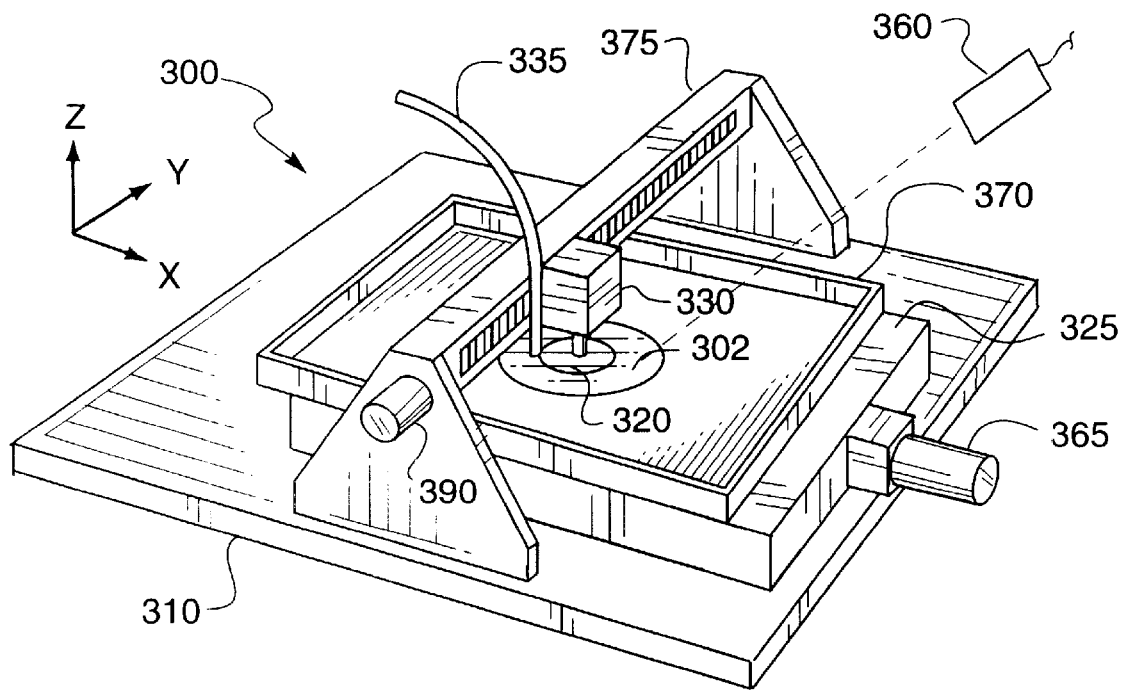
FIG. 5 is an illustrative example of a micropolishing system for selectively polishing a local region of a metallic layer on a workpiece, in accordance with the invention.

FIG. 5 is a schematic representation of a polisher 300 for selective polishing of a local region of a copper layer on a workpiece, in accordance with the invention. The polisher can be used to selectively polish localized regions of copper on a wafer, before the wafer is subjected to a CMP process which polishes the wafer in accordance with a predetermined polish profile. In FIG. 5, the polisher 300 includes a base 310 to which is mounted an x-motion stage 325 equipped with a controllable drive motor 365. A fluid container pan 370 is mounted on top of the x-axis stage to contain process liquids and to form a holding base for the workpiece 302. A y-motion overhead translator 375 with its controllable drive motor 390 is also mounted to base 310. A polishing head 330, including a polisher drive motor coupled to, and providing orbital motion to, a polishing pad 320, is mounted to the y-axis translator 375 so that the polishing pad can be positioned in the y-direction under control of motor 390. The polishing head 330, also includes a controllable forcing mechanism, not shown, to forcibly press the polish pad 320 against workpiece 302 as desired. The forcing mechanism may be a load cell and linear motor, a pneumatic cylinder, a mechanism for adding and removing weight, or other forcing mechanism to press the polishing pad 320 against the workpiece. The preferred forcing mechanism (not shown) is a pneumatic air bladder between the polisher drive motor in the polishing head 330 and the pad holder. The x-motion stage 325 translates the workpiece 320 in the x-direction. The combined motion of the x-stage 325 and the y-motion translator 375 permits controlled positioning of the polishing pad 320 so that pad 320 may reach any selected area on the workpiece. As illustrated, the polisher 300 also includes a slurry supplying port 335 directed toward the surface of wafer 302 for slurry distribution across the surface. In another embodiment slurry is delivered to the wafer surface via small through holes in the polishing pad.

As explained above, during operation, polishing is controlled by the controller 380. The controller 380 uses data obtained from monitor 360 that interrogates the surface of wafer 302. The monitor can be an optically based reflectance or film thickness measurement device. One such device is available from Filmetrics Corporation of San Diego, Calif., but others may also be used. The monitor can be of a direct contact probe method in the case of metal films. The metal film probe system measures resistance between contacts and converts the resistance values into thin-film thickness measurements. Such systems can be adapted from systems available from Bridge Technology from Chandler Heights, Ariz., for example. For a direct contact probe, the probe must be mounted so that it can separate from the pad, engage the surface or the wafer to determine thickness.

For the FIG. 5 embodiment, the controller 380, based on information from monitor 360, controls motors 365 and 390 as well as polishing head 330 and the load applied to a the polisher (not shown).

The workpiece may also move, and need not be stationary, as in the embodiment of FIG. 5. Thus, in the embodiment of FIG. 6, the wafer 302 is held in a carrier 415 driven by a motor 450 using, for example, a v-belt pulley arrangement 455, as is well known in the art. Thus, in the example shown in FIG. 6, the wafer 302 rotates while the polisher rotates, and translates in a y-direction. In accordance with the invention, motion of the carrier 415 is also controlled by the control system discussed above. Thus, the speed of motor 450, a variable in the polishing process that affects material removal rate, is controlled. In addition, motor 450 can be operated in a stepwise mode whereby specific areas of the wafer are brought adjacent to the polishing pad 320 by the combination of rotary motion of the wafer 302 and the y-motion system 375 that moves the polishing head 330, and then polished by the polishing head 330.

As discussed above, in some embodiments of the invention, the polishing pad should be sized for selective polishing of local regions of a workpiece surface. It should be understood that in conducting selective polishing, the polishing pad will, to some extent, also encroach on and polish already conforming workpiece surfaces, that are either coplanar or that conform to a desired curvature. However, in accordance with the invention, suitably sizing the polishing pad surface and exercising proper control, as explained above, will achieve the objective of selectively polishing local regions of the copper layer to a state where the entire copper layer can then be effectively polished in accordance with a predetermined polish profile. The sizing of the polishing pad depends upon the size of the workpiece and the size of local regions which require selective polishing. For example, for a 200 mm diameter silicon wafer, the polishing pad surface area may be sized in the range from about 0.025 square centimeters to 20 square centimeters, preferably 2 square centimeters to 4 square centimeters. One pad shape has a continuous surface terminated at the edges in a circular shape. Other shapes of the pad may be advantageously chosen to affect removal rate, such as square pad with rounded corners, triangular shaped pad, or any patterned shape. Note that it may also be advantageous to have some small holes or other shapes cut-out in the pad to facilitate slurry transport to the surface of the wafer. In the preferred embodiment, the pad has a continuous surface terminated at the edges in a circular shape with small holes of less than 1 millimeter in diameter throughout the pad to facilitate slurry transport to the wafer to pad interface. The polishing pad itself may be fabricated from any material suitable for use in CMP, when that type of polishing process is utilized. Otherwise, a fixed abrasive material, such as is known in the art, may also be used.

Two of the important variables in polishing are speed of polishing movement and applied polishing force. In accordance with the invention, in order to achieve commercially useful polish times, high speed polishing motions are preferred. Thus, if the polishing motion is by rotation of the polishing pad, then the pad should be rotated at a speed of about 500 rpm to about 20,000 rpm, preferably from about 5,000 rpm to about 10,000 rpm at an applied force of about 6,000 to about 42,000 $Nt/m^2$, preferably 14,000 to about 28,000 $Nt/m^2$ in the event that the workpiece is a silicon semiconductor.

While the foregoing description has focused largely on the use of polishing pads to achieve polishing of selected regions of a copper layer on the workpiece surface, other techniques may also be used. For example, instead of a polishing pad, a brush polishing electrode, a conventional electropolishing electrode, or a bipolar electrode assembly may be used to selectively electropolish local regions on thin metal films that are non-coplanar or non-conforming with a desired curvature. Alternatively, a simple selective chemical etch on selected areas of the workpiece may be utilized. Controlling and applying chemicals that etch the surface of the workpiece are well known techniques in the art, albeit that it is not known to selectively etch only certain localized areas of thickness divergence, as required in the invention.

Figure 6:
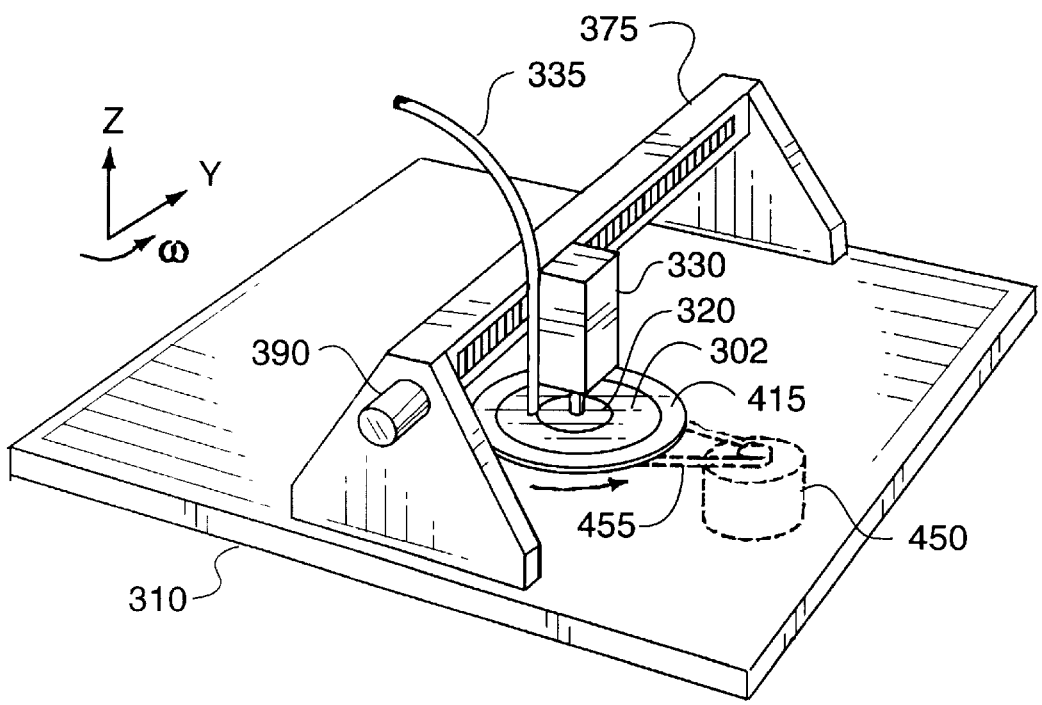
FIG. 6 is another illustrative example of a micropolishing system for selectively reducing a region of a metallic layer on a workpiece, in accordance with the invention.
Figure 7:
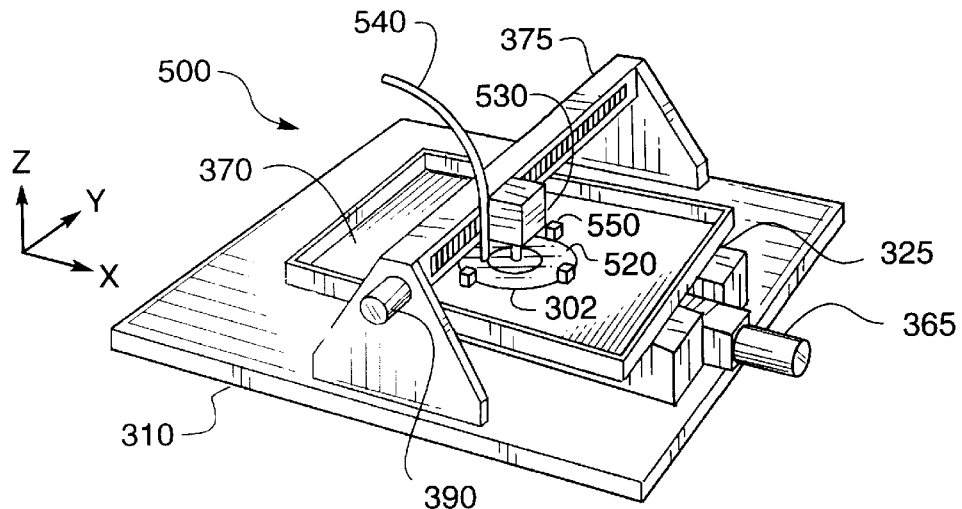
FIG. 7 is a further example of a micropolishing system for selectively reducing a region of a metallic layer on a workpiece, in accordance with the invention.

FIG. 7 shows a micropolisher unit 500 employing either a standard brush or standard electrode electropolishing to practice the current invention. The majority of the components are identical to or similar to the FIGS. 5 and 6 version of the micropolisher, the differences are explained herein. Brush 520 is attached to electrode 540 and rubs on the surface of the wafer 302. If standard electrode is used instead of a brush electrode, then standard electrode (not shown) mounted so that it is close to but not touching the workpiece surface 10. Counter electrodes 550, three shown, (one identified in drawing) contact the metallized workpiece on the very edge. An electropolishing solution is supplied to the interface between brush 520 and the surface of wafer 302 by one of several ways, such as immersion of the wafer 302 in the electropolishing solution, by dispensing the electroplating solution adjacent to brush, or by delivering the solution through a hollow electrode 540 to the brush directly, or by other methods one knowledgeable in the art can contrive. Conventional electropolishing is performed by supplying a current between the two electrodes in a manner to polish the surface of wafer 302. Precise control of the polishing current, time, and location of the brush on the workpiece surface 10 allows for precise polishing of selected areas of the wafer 302 to improve uniformity of a previous electropolishing step using a full area electrode or improve the uniformity of a previous CMP step. Alternatively, the precise control of the polishing current, time, and location of the brush on the workpiece surface allows for precise polishing of selected areas of the wafer 302 to improve uniformity of a previous electroplating step, before the workpiece is presented for polishing using CMP. Ideally, there should remain on the workpiece surface a conductive surface layer for this method to work well.

As an alternative to the conventional two electrode electropolishing, a bipolar electrode can be used without requiring direct contact with the workpiece surface with the counter electrode 550 nor does the bipolar electrode method and apparatus require a continuous conductive surface layer for electropolishing work. Commonly owned U.S. Pat. No. 6,121,152, is hereby incorporated by reference to the extent useful to amplify the technology relating to bipolar electrodes.

From the foregoing description, it will be clear to those in the art how micropolishers as shown in FIGS. 5–7 can be used in connection with commercially available CMP and other polishing, to practice a method according to the present invention. Specifically, the micropolisher of FIGS. 5–7 is used to selectively polish local regions of a copper layer on a workpiece, to bring those local regions to a state where the copper layer can be polished by a commercially available polishing machine configured to polish the copper layer in accordance with a predetermined polish protocol to achieve a desired surface profile. Thus, if the local regions of the copper layer are located at the periphery (or skirt) of the workpiece, the apparatus of FIGS. 5–7 would polish those local regions to a predetermined state, and then a polishing machine would polish the entire copper layer in accordance with a predetermined polish protocol to achieve a desired surface profile.

Figure 9:
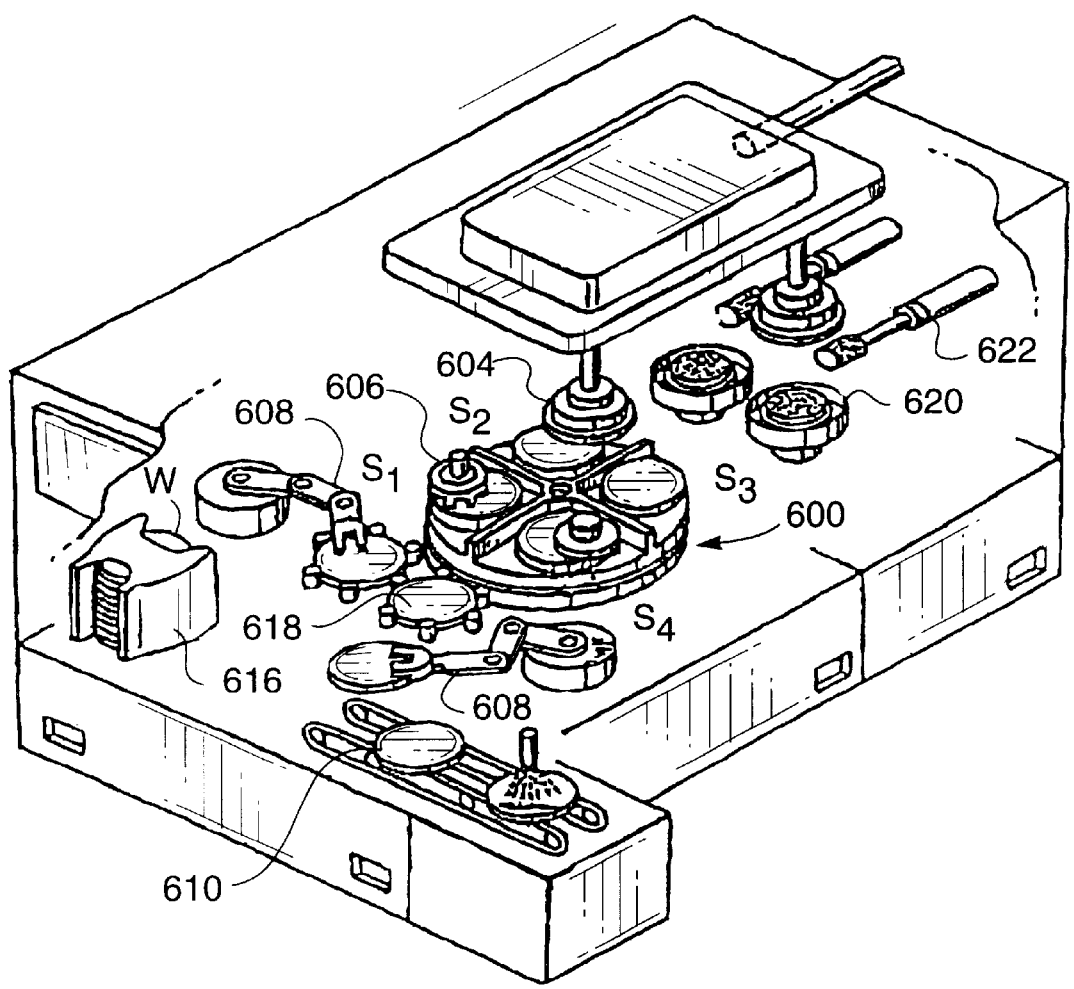
FIG. 9 is a schematic illustration, in partial cutaway, showing an embodiment of a chemical mechanical polishing tool useful in practicing the invention.
Figure 10:
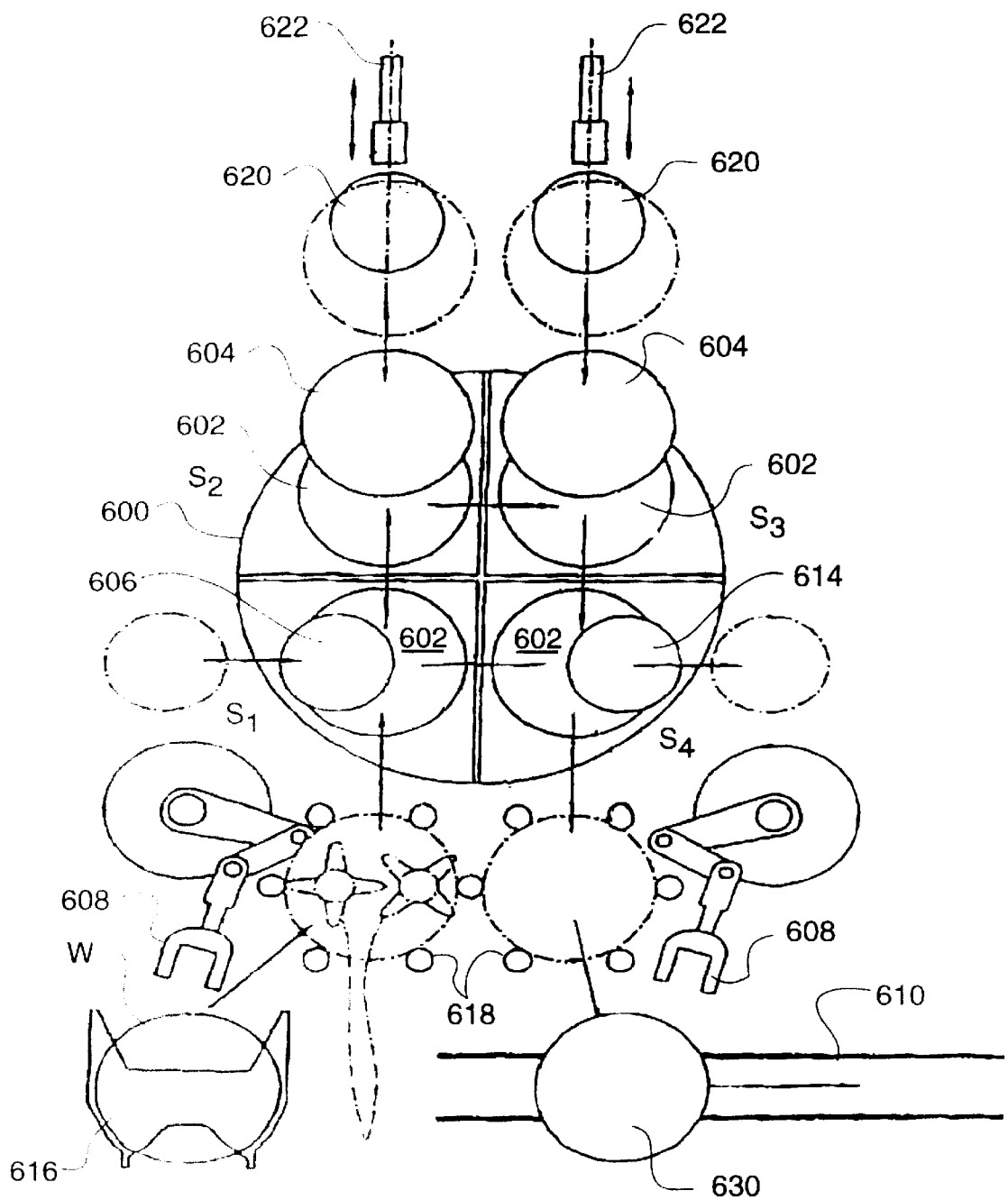
FIG. 10 is a schematic illustration of details of the tool of FIG. 9.

FIGS. 9 and 10 show in pertinent part, a schematic of an embodiment of a CMP tool that is also useful in practicing the present invention, with modifications discussed herebelow. A more detailed description may be found in published patent application GB 2 324 750, which is hereby incorporated by reference, to the extent relevant. Other CMP tools may also be used in practicing the invention such as that shown in U.S. Pat. No. 5,329,732, also here incorporated by reference, to the extent relevant.

The illustrated automatic polishing apparatus comprises an index table 600, a loading station S1, a primary polishing station S2, a secondary polishing station S3, and an unloading station S4. The loading station S1, the primary polishing station S2, the secondary polishing station S3, and the unloading station S4 are set up along the circumference of the index table 600. The index table 600 has a plurality of holders 602 which are disposed along a concentric circle. Each of the holders supports a wafer thereon. The stations S1 to S4 are sequentially given a rotational feed. The stations S1 to S4 are assigned at stop positions of the index table 602. More particularly, the polishing stations are positioned at stop positions, each of which may be called a first stop station. The loading station is positioned at a second stop position of the index table 602. The unloading station is positioned at a third stop position of the index table 602.

In general, a wafer to be polished travels from station S1 to station S4 in the apparatus. The loading station S1 is a region for use in transferring the wafer W onto the index table 600.

The unloading station S4 is a region for use in transferring the polished wafer from the index table 600. The upper surface of the index table 600 is divided into four blocks at predefined angular distances of 90 degrees by partition walls 612. The wafer holders 602 are positioned within each of the four blocks. The primary polishing station S2 is usually a region for use in planarizing the surface of the wafer W which is transferred onto the index table 600, and in accordance with an embodiment and mode of operation of this invention, is used to selectively polish local regions of a wafer that are outside a predetermined surface profile, prior to an overall surface polish. The secondary polishing station S3 is in one mode of operation of the invention used to carry out a final process to planarize the wafer.

The index table 602 is driven by a stepping motor to rotate in essentially uniform angular movement of 90 degrees, in order to sequentially stop positions of the index table. Each of the holders 602 is for supporting a wafer thereon. In the example being illustrated, each of the holders has a vacuum chuck (not shown in detail) positioned on an upper surface. The vacuum chuck is for holding the wafer by a suction force. Each of the stations S1 to S4 has a motor (not shown) for driving its associated holders 602. Each holder is supported through a bearing on the index table. Each holder has an electromagnetic clutch which is selectively connected to the motor.

The loading station S1 is equipped with a robot arm 608, a wafer back-surface washing member 614, and a chuck washing member 606. The robot arm 608 takes wafers W out of a wafer carrier 616 in a one-by-one manner to transfer the wafer W to a location under a pin clamp to transfer the wafer W onto the index table 600 after wafer back-surface washing process. The pin clamp 618 has several pins which are shrinkably and expandably disposed at selected positions aligned along the same circumference. The wafer back-surface washing member 614 is for use in washing the back surface of the wafer W held by the pin clamp 618. The wafer back-surface washing member 614 may be, for example, brushes or the like.

According to one embodiment of the present invention, this primary polishing station S2 is used to reduce the profile of selected local regions into closer conformity with other regions of the wafer surface as a preparatory step for secondary polishing of the entire wafer surface in a next step. In order to achieve this, the polishing pad may be of reduced size to permit better localization of polishing. Alternatively, the polish pad may be full-sized, but advanced to a polish position such that only a portion of the pad is in contact with the wafer. This mode of polishing is useful when the local region of thicker than desired layer is in a peripheral area of the wafer, which might then be selectively polished into closer conformity with surrounding wafer surface regions. Once such closer uniformity is achieved, as may be detected using wafer surface monitors, the polish pad may be further advanced automatically over the wafer to then polish the entire wafer surface to achieve improved overall planarization.

The secondary polishing station S3 is similar in structure to the primary polishing station S2. The secondary polisher station S3 has a pad conditioner member 620 and a pad cleaning member 622 in addition to a polishing head 624. When a mode of operation is used wherein S2 is equipped with a smaller polish pad, then the prepolished wafer may be transferred to the polisher S3 where it is subject to surface finishing treatment by a fall sized polishing head 624. Once the secondary polishing process is ended, the index table 600 rotates by the predetermined angle (90 degrees) so that the wafer W is effectively transferred to the unloading station S4. On the other hand, when an alternative mode of operation is employed wherein the polish pad on S2 is initially only partially advanced to selectively polish peripheral wafer areas, then each of stations S2 and S3 can be used to perform both selective polishing and subsequent overall polishing on its own separate wafer. Thus, each of stations S2 and S3 produces a planarized wafer at the end of its staged polish process.

Again referring to FIGS. 9 and 10, the unloading station S4 is equipped with a wafer surface washing member 614 and a robot arm 608. The wafer surface wash member 614 may be, for example, a brush for washing the surface of the wafer W.

During washing, the holder 602 supporting the wafer W is rotated. The wafer surface washing member 614 is pressed onto the rotating wafer W to wash the wafer W. In the example being illustrated, the wafer surface washing member 614 may be a rotatable disk-shaped brush. On washing the wafer W, the disk-shaped brush is moved from a refuge or "wait" position to above the holder 602. After washing the wafer W, water and air blows out of the vacuum chuck by a reverse or back pressure to unlock the wafer from the holder. The robot arm 608 shifts the wafer W which is taken out of the holder 602 by the pin clamp 618 onto a conveyer. The polished wafer W is transferred to a subsequent process step by the conveyer 610. The index table 600 is rotated by the predetermined angle (90 degrees) to transfer the holder 602 to the loading station S1. The index table 600 is then ready for entry of a next wafer.

In the above-mentioned embodiment, the wafer held by the pin clamp is introduced to the loading station S1. The index table is rotated in the predetermined angle (90 degrees) at a time. The wafer sequentially undergoes planarization process and finish treatment through the primary polishing station S2 and the secondary polishing station S3. The wafer W is delivered to the outside from the unloading station S4 while simultaneously carrying out the planarization process and the finishing treatment for another wafer on the index table 600. In the above-mentioned embodiment, a wafer W is attached to the vacuum chuck of the holder 602 disposed on the index table 600 and the polishing head goes down to press the wafer W, in order to carry out the planarization process along with finish processing. It is possible to always watch the polished surface of the wafer W in case where the polishing head has a diameter less than that of the wafer. It is possible to freely set up the rotating speed and polishing pressure of the holder 602 while measuring a condition of the wafer surface and a polishing thickness of the polished wafer. As a result, it is possible to carry out the polishing process with respect to the wafer W with the processing criteria optimized.

Even if certain time differences are found between the planarization process in the primary polishing station S2 and the finish process in the secondary polishing station S3, it becomes possible, by shifting the polishing start time points of both polishing processes so as to ensure that the processing end time points are identical to each other, to shorten the time period spanning up to the washing after completion of the polishing. Furthermore, it is possible to prevent elimination of dry-hardening and attachment of abrasive fluid to wafers after polishing.

In the above-mentioned embodiment, the dimension of the suction-support plane of the holder 602 for suction support of a wafer is set less than at least the outer diameter of the wafer. Accordingly, the wafer transfer to the loading station S1 and wafer transportation from the unloading station S4 are carried out by the pin clamp. If the suction-support plane of the holder is less than the wafer outer diameter, the wafer is supported with part extended beyond the outer edge of the holder. When the wafer is transferred to the holder of the loading station and when the wafer is taken out of the unloading station, a wafer extension part is held by the pin clamp. As a result, it is easy to transfer the wafer to the holder and to take the wafer out of the holder.

During polishing at the primary polishing step, the holder supporting the wafer may be rotated at a speed of approximately 50 to 300 rpm while local regions of divergent profile are selectively polished. The polishing head rotating at 50 to 1000 rpm is reciprocated over the wafer at a speed of 0.1 to 5 cm/second. The above operation is done while supplying abrasive fluid (slurry) from the center of the polishing cloth to the upper surface of the wafer.

After the selective polishing of local regions is completed in the primary polishing station to achieve a closer match between local region profile and profile on the other wafer surface areas, or until a predetermined profile is achieved, duration, the pressure of the polishing head is first set in the condition of no load application. The abrasive fluid as presently supplied from the center section of the polishing cloth is replaced with pure water thereby rapidly removing the abrasive fluid out of the upper surface of the copper film.

Thereafter, the polishing head 624 is pulled and separated from the wafer. The polishing head is subject to fiber recovery or refreshing treatment by the pad conditioner member 620. During execution of the pad conditioning process, the index table is rotated by 90 degrees. As a result, the wafer W is shifted to the secondary polishing station S3. This rotation permits addition of a new wafer to the primary polishing station S2.

In the secondary polishing station S3, the polishing head is preferably enclosed by a hood during polishing. Cleaning fluid is continuously fed to the inner wall of the hood during polishing process of a wafer thereby eliminating hardening of a splashed abrasive fluid along with vaporization of liquid components of the abrasive fluid, in a way similar to that of the primary polishing station. When the cleaning water fed from the water seal room is supplied from the outside of the vacuum chuck, it is possible to eliminate immersion or "invasion" of the abrasive fluid to the wafer back surface during polishing.

The secondary polishing station S3 may be provided with a photometer (not shown) which detects a change in reflectivity of laser light on the wafer surface. A high-pressure nitride gas or high-pressure air or pure water is blown onto the wafer at the laser light incident position thereof thereby removing any abrasive fluid residing on the wafer. The polishing end point may be set at an instant at which the reflectivity is lowered due to complete polishing of the copper film at locations other than lead groove regions. In the automatic polishing apparatus of this invention, the polishing head is designed to be less in diameter than a wafer and is capable of traversing the wafer surface. Therefore, it is possible to detect the polishing end point by constantly monitoring the surface condition of the wafer.

In the unloading station S4, the holder 602 typically consists of a vacuum chuck (not shown) for supporting the wafer. The holder may be rotated at a rate of about 50 rpm. The brush (not shown) of the wafer surface washing member 606 is pressed onto the wafer in order to clean the wafer. The brush may rotate at the same rate of about 50 rpm. The cleaning fluid may be either pure water or electrolytic ionized water. After washing, the wafer is subjected to the back pressure of the air and pure water to the suction surface of the vacuum chuck to be released. The robot arm 608 transports the wafer onto the conveyer 610 which rapidly transfers the wafer to the next process.

The foregoing description provides an enabling disclosure of the invention, which is not limited by the description, but only by the scope of the appended claims. All those other aspects of the invention, and their equivalents, that will become apparent when a person of skill in the art has read the foregoing, are within the scope of the invention and of the claims herein below.

We claim:

1. A method of polishing a workpiece having a copper pattern on a surface thereof, comprising the steps of:

(a) identifying a local surface region of the workpiece that has a surface profile significantly divergent from surface profiles of other surface regions of the workpiece;

(b) selectively treating the identified local region, to achieve a surface profile more closely approximating the profiles of other regions of the workpiece surface; and (c) treating the workpiece surface in accordance to achieve a predetermined surface profile, after the selective treating.

2. The method of claim 1, wherein said local region is located proximate a periphery of the workpiece surface.

3. The method of claim 1, wherein said workpiece comprises a semiconductor wafer, and the wafer has a central area containing electronic circuits, and wherein at least a portion of the local surface region is located outside of said circuit containing area.

4. A method of improving surface uniformity of a semiconductor wafer undergoing fabrication of electronic components comprising copper therein, the semiconductor wafer having a surface comprising a metallic pattern, the method comprising:

(a) identifying a local region of the metallic pattern with a profile that diverges to an unacceptable extent in profile from other regions of the wafer surface;

(b) selectively treating the identified local region to bring the profile thereof into closer conformity with profiles of other regions; and (c) subjecting the selectively treated wafer to treatment to achieve a desired surface configuration.

5. The method of claim 4, wherein the selectively treating comprises treating by a method selected from chemical mechanical polishing, polishing with a fixed abrasive medium, chemical etching, and electropolishing.

6. A method of improving surface uniformity of a polished surface of a semiconductor wafer undergoing fabrication of electronic components therein, the semiconductor wafer having a surface comprising a pattern, the method comprising:

(a) identifying local regions of the pattern with profiles that diverge to an unacceptable extent from profiles of a standard workpiece;

(b) selectively treating the local regions to bring profiles thereof into closer conformity with profiles of the standard workpiece; and (c) subjecting the selectively treated wafer to polishing to achieve a desired surface configuration.

7. The method claim 6, wherein the identifying comprises:

comparing the surface of the workpiece with a standard workpiece surface.

8. The method of claim 6, wherein the identifying comprises:
   (a) preparing a standard workpiece;
   (b) measuring a surface of the standard workpiece; and
   (c) using the measurement of the standard workpiece to identify the local regions of the inlaid pattern.

9. The method of claim 6, wherein the selectively treating comprises applying a process selected from: chemical mechanical polishing, polishing with a fixed abrasive medium, chemical etching, and electropolishing.

10. The method of claim 1, wherein said workpiece comprises a semiconductor wafer, and the wafer has an area in which electronic circuits are formed, and wherein at least a portion of the local surface region is located within said circuit containing area.

* * * * *